United States Patent
Lei et al.

(10) Patent No.: US 10,665,656 B2
(45) Date of Patent: May 26, 2020

(54) OLED DISPLAY PANEL

(71) Applicant: Wuhan China Star Optoelectronics Technology Co., Ltd., Wuhan (CN)

(72) Inventors: Lu Lei, Wuhan (CN); Yexi Sun, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/097,278

(22) PCT Filed: Sep. 14, 2018

(86) PCT No.: PCT/CN2018/105615
§ 371 (c)(1),
(2) Date: Oct. 29, 2018

(87) PCT Pub. No.: WO2019/205439
PCT Pub. Date: Oct. 31, 2019

(65) Prior Publication Data
US 2019/0326377 A1 Oct. 24, 2019

(30) Foreign Application Priority Data

Apr. 24, 2018 (CN) .......................... 2018 1 0374112

(51) Int. Cl.
*H01L 27/32* (2006.01)
*H04M 1/02* (2006.01)
(Continued)

(52) U.S. Cl.
CPC ...... *H01L 27/3262* (2013.01); *H01L 51/5012* (2013.01); *H01L 51/5206* (2013.01); *H01L 51/5237* (2013.01); *H04M 1/0266* (2013.01)

(58) Field of Classification Search
CPC ............. H01L 51/5012; H01L 51/5237; H01L 51/5206; H01L 27/3262; H04M 1/0266
See application file for complete search history.

(56) References Cited

U.S. PATENT DOCUMENTS

| 2005/0179379 A1* | 8/2005 | Kim ....................... H05B 33/04 313/512 |
| 2015/0049428 A1* | 2/2015 | Lee ....................... G06F 1/1652 361/679.27 |

(Continued)

FOREIGN PATENT DOCUMENTS

| CN | 107481669 A | 12/2017 |
| CN | 107610636 A | 1/2018 |

(Continued)

*Primary Examiner* — Jasmine J Clark
(74) *Attorney, Agent, or Firm* — Leong C. Lei

(57) ABSTRACT

An OLED display panel and a mobile phone are disclosed. The OLED display panel includes a transparent display region and an effective display region that surrounds the transparent display region and completely covering an OLED display panel. The transparent display region is used for installing an electric device in front of the mobile phone and disposed below the transparent display region, which can achieve a high screen occupation ratio to give users a better visual experience. Additional and patterned OLED anode layer and the OLED light-emitting layer are arranged in the effective display region comparing to the transparent display region, except for the OLED anode layer and the OLED light-emitting layer, the effective display region and the transparent display region are provided with same film layers, and the same film layers is finished in a same manufacturing process, which can avoid an irregular-shape cutting, simplify production process and reduce cost.

10 Claims, 2 Drawing Sheets

(51) Int. Cl.
*H01L 51/50* (2006.01)
*H01L 51/52* (2006.01)

(56) References Cited

U.S. PATENT DOCUMENTS

2016/0141426 A1* 5/2016 Chang ............... H01L 29/78696
257/43
2017/0012089 A1* 1/2017 Kim .................... H01L 27/3244

FOREIGN PATENT DOCUMENTS

| CN | 107633807 A | 1/2018 |
| CN | 107633812 A | 1/2018 |
| CN | 107863374 A | 3/2018 |

* cited by examiner

OLED DISPLAY PANEL

FIELD OF THE INVENTION

The present invention relates to a display technology field, and more particularly to an OLED display panel.

BACKGROUND OF THE INVENTION

The Organic Light Emitting Diode (OLED) is a very promising display product with a thin, light, wide viewing angle, active light emission, continuous and adjustable light color, low cost, fast response speed, and energy consumption, low driving voltage, wide operating temperature range, simple production process, high luminous efficiency, and flexible display such that the OLED are favored by major display panel manufacturers, and have become the main force of the third-generation display devices in the display technology field.

In recent years, with the development of portable electronic display devices, the pursuit of a high screen occupation ratio and the ultra-narrow frame, so-called "full-screen" display panel has become a research and development hotspot in the field of middle and small size display panels, and has been applied in the display panel of the mobile phone.

The "full-screen" has the advantage of being able to maximally utilize the display area of the display panel, giving the user a better visual experience. At the same time, the outstanding difficulty of the "full-screen" design is how to position the front camera on the upper front of the mobile phone, the ambient light sensor, earpiece, and other light-sensing devices so as to occupy the smallest screen area without affecting the normal functions of the front camera, ambient light sensor, earpiece, and other light-sensing devices.

In order to solve the above problems, different display product manufacturers adopt different technical solutions. For example, Apple's iPhone X series mobile phones uses an OLED display panel with cutting for irregular shape. A U-shaped groove is cut in the middle of the top of the OLED display panel. A device such as an infrared sensor, a distance sensor, an ambient light sensor, a front camera, and an earpiece is installed in the U-shaped groove. However, the OLED display panel with cutting for irregular shape has obvious disadvantages, for example, the irregular shape cutting process is complicated, and the production cost is obviously increased; the film packaging of the irregular-shape cutting region is more difficult and the reliability of the package is decreased; The line layout of the GOA near the U-shaped groove is different from other areas, which may cause uneven display brightness in the area; when playing a picture or video in full screen, the U-shaped groove region will block part of the image.

Therefore, there is an urgent requirement to propose a high screen occupation ratio OLED display panel that avoids irregular-shape cutting.

SUMMARY OF THE INVENTION

An object of the present invention is to provide an OLED display panel, which can be applied to a mobile phone and can achieve a high screen occupation ratio, avoid irregular-shape cutting, simplify the manufacturing process, and reduce the production cost.

An object of the present invention is further to provide a mobile phone, which can be applied to a mobile phone and can achieve a high screen occupation ratio, avoid irregular-shape cutting, simplify the manufacturing process, and reduce the production cost.

In order to realize the above purpose, the present invention provides an OLED display panel, comprising: at least one transparent display region and an effective display region that surrounds the transparent display region and completely covering an OLED display panel; multiple OLED D disposed in the effective display region for displaying an image, and each OLED includes an OLED anode layer and an OLED light-emitting layer; wherein except for the OLED anode layer and the OLED light-emitting layer, the effective display region and the transparent display region are provided with same film layers.

Wherein the transparent display region includes a substrate, a thin film transistor layer, a planarization layer, an organic photoresist layer, an OLED cathode layer, and an encapsulation layer which are stacked sequentially from bottom to top; wherein the effective display region includes: the substrate; the thin film transistor layer stacked on the substrate; the planarization layer stacked on the thin-film transistor layer, and the planarization layer located in the effective display region is provided with a first via hole; an OLED anode layer provided on the planarization layer and connecting the thin film transistor layer through the first via hole; the organic photoresist layer stacked on the thin film transistor layer and the OLED anode layer and the organic photoresist layer located in the effective display region is provided with a second via hole and the second via hole exposes the OLED anode layer; an OLED light-emitting layer filled in the second via hole and connected to the OLED anode layer; the OLED cathode layer stacked on the organic photoresist layer and the OLED light-emitting layer; and the encapsulation layer stacked on the OLED cathode layer; in the effective display region, the OLED anode layer, the OLED light-emitting layer and the OLED cathode layer form the OLED.

Wherein the same film layers in the transparent display region and the effective display region can be manufactured in same processes.

Wherein the transparent display region is located at an upper edge of the OLED display panel.

Wherein a material of the substrate is polyimide (PI).

Wherein a material of each of the planarization layer and the organic photoresist layer is a transparent organic material.

Wherein a material of the OLED anode layer is a stacked combination of Indium Tin Oxide (ITO) and silver.

The present invention also provides a mobile phone, comprising: an OLED display panel as described above; and an electronic device which is disposed below the transparent display region and placed in front of the mobile phone.

Wherein a shape and a size of the transparent display region is matched with a shape and a size of the electronic device which is disposed below the transparent display region and placed in front of the mobile phone.

Wherein the electronic device placed in front of the mobile phone is one of a camera, a distance sensor, an infrared sensor and an ambient light sensor.

The beneficial effects of the present invention: in the OLED display panel of the present invention, by disposing the transparent display region and the effective display region that surrounds the transparent display region and completely covering the OLED display panel, applying the OLED display panel of the present invention to a mobile phone can achieve a high screen occupation ratio to give users a better visual experience; the additional and patterned OLED anode layer and the OLED light-emitting layer are arranged in the effective display region comparing to the transparent display region. Except for the OLED anode layer and the OLED light-emitting layer, the effective display region and the transparent display region are provided with same film layers, and the same film layers can be finished in a same manufacturing process, which can avoid an irregular-shape cutting, simplify production process and reduce production cost. The mobile phone of the present invention includes the above-mentioned OLED display panel. An electronic device E placed in front of the mobile phone corresponding to the bottom of the transparent display region not only has a high screen occupation ratio, but also can avoid irregular-shape cutting, simplify the production process, and reduce production cost.

BRIEF DESCRIPTION OF THE DRAWINGS

For a further understanding of the features and technical content of the present invention, referring to the following detailed description of the invention and the accompanying drawings. However, the drawings are provided for reference and description only, and not intended to limit the present invention.

In the drawings.

DETAILED DESCRIPTION OF PREFERRED EMBODIMENTS

Figure 1:
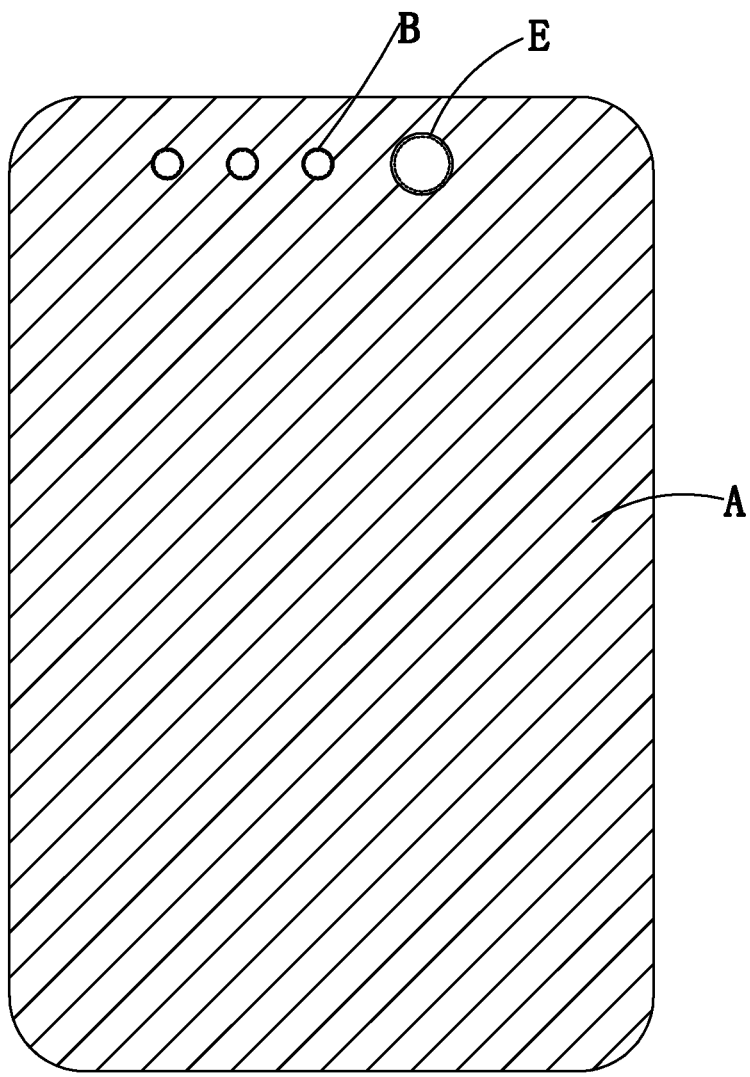
FIG. 1 is a planar top view of an OLED display panel according to the present invention.

In order to further illustrate the technical solution and effect taken by the present invention, the following detailed description is made in conjunction with the preferred embodiments of the present invention and the accompanying drawings. It should be noted that, in the present application, the drawings are only schematic diagrams. Unless otherwise specified, it does not mean that the actual thickness ratio, flatness, and shape between the film layers are the same as those in the drawings. It can be understood that because of the limitation of the process, the actual product may have some differences comparing to the schematic diagram. For example, the shape of the hole and the shape of the combined portion of each film layer may differ from the schematic diagram, which can be understood and known by those skilled in the art.

Figure 2:
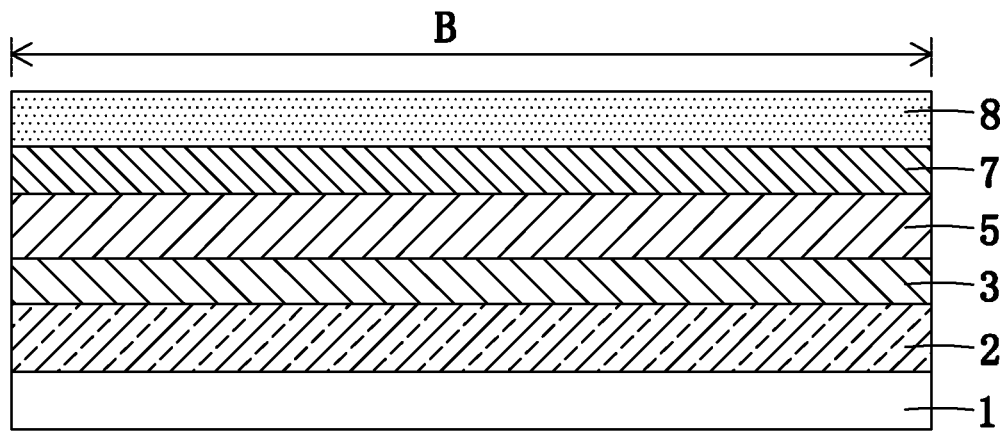
FIG. 2 is a schematic cross-sectional view of a transparent display region of an OLED display panel according to the present invention.
Figure 3:
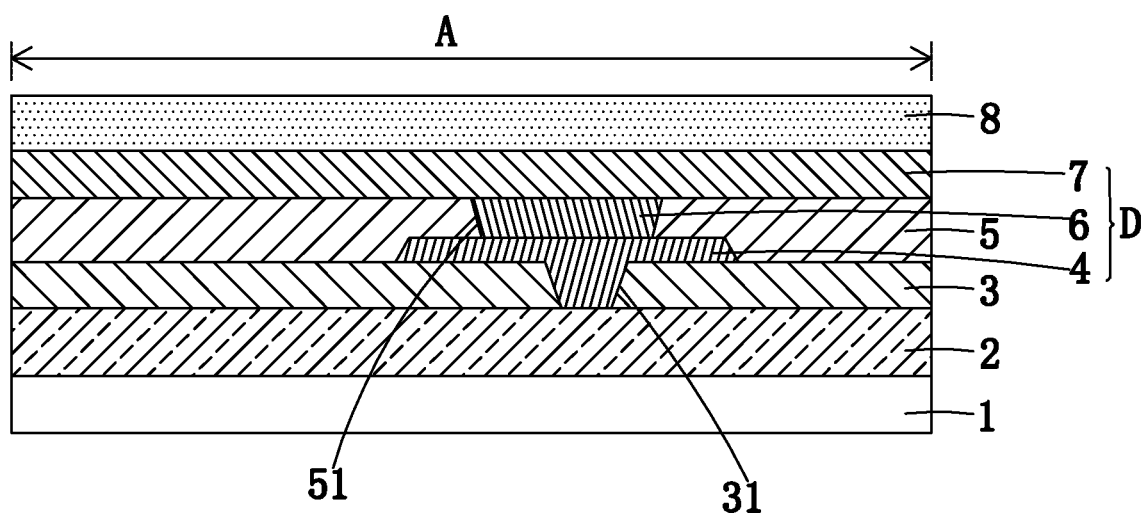
FIG. 3 is a schematic cross-sectional view of an effective display region of an OLED display panel according to the present invention.

With reference to FIG. 1 to FIG. 3, the present invention provides an OLED display panel including at least one transparent display region B and an effective display region A that surrounds the transparent display region B and completely covering the OLED display panel. When the OLED display panel is applied to a mobile phone, the transparent display region B is used to place an electronic device E which is disposed below the transparent display region B and placed in front of the mobile phone; multiple OLED D are disposed in the effective display region A for displaying an image.

Specifically:

The transparent display region B is preferably designed on an upper edge of the OLED display panel and arranged in a straight line direction.

In the OLED display panel of the present invention, by disposing the transparent display region B and the effective display region A that surrounds the transparent display region B and completely covering the OLED display panel, applying the OLED display panel of the present invention to a mobile phone can achieve a high screen occupation ratio to give users a better visual experience.

Specifically:

As shown in FIG. 2, the transparent display region B includes a substrate 1, a thin film transistor layer 2, a planarization layer 3, an organic photoresist layer 5, an OLED cathode layer 7, and an encapsulation layer 8 which are stacked sequentially from bottom to top.

As shown in FIG. 3, the effective display region A includes:

the substrate 1;

the thin film transistor layer 2 stacked on the substrate 1;

the planarization layer 3 stacked on the thin-film transistor layer 2, and the planarization layer 3 located in the effective display region A is provided with a first via hole 31;

an OLED anode layer 4 provided on the planarization layer 3 and connecting the thin film transistor layer 2 through the first via hole 31;

the organic photoresist layer 5 stacked on the thin film transistor layer 2 and the OLED anode layer 4 and the organic photoresist layer 5 located in the effective display region A is provided with a second via hole 51 and the second via hole 51 exposes the OLED anode layer 4;

an OLED light-emitting layer 6 filled in the second via hole 51 and connected to the OLED anode layer 4; the OLED cathode layer 7 stacked on the organic photoresist layer 5 and the OLED light-emitting layer 6; and the encapsulation layer 8 stacked on the OLED cathode layer 7.

As shown, additional and patterned OLED anode layer 4 and the OLED light-emitting layer 6 are arranged in the effective display region A comparing to the transparent display region B, so that in the effective display region A, the OLED anode layer 4, the OLED light-emitting layer 6 and the OLED cathode layer 7 form the OLED D for displaying an image; except for the OLED anode layer 4 and the OLED light-emitting layer 6, the effective display region A and the transparent display region B are provided with same film layers, and the same film layer is basically tiled over the entire surface.

The same film layers in the transparent display region B and the effective display region A can be manufactured in the same process, except that during the process of the planarization layer 3, the planarization layer 3 in the effective display region A requires forming the first via hole 31, and the planarization layer 3 located in the transparent display region B does not require forming a via hole, and during the process of the organic photoresist layer 5, the organic photoresist layer 5 in the display region A requires forming the second via hole 51, and the organic photoresist layer 5 in the transparent display region B does not require forming a via hole.

In the OLED display panel of the present invention, the additional and patterned OLED anode layer 4 and the OLED light-emitting layer 6 are arranged in the effective display region A comparing to the transparent display region B. Except for the OLED anode layer 4 and the OLED light-emitting layer 6, the effective display region A and the transparent display region B are provided with same film layers, and the same film layers can be finished in a same manufacturing process, which can avoid an irregular-shape cutting, simplify production process and reduce production cost.

Furthermore, the material of the substrate 1 is a flexible high transparent material such as polyimide (PI); the thin film transistor layer 2 includes a thin film transistor element, an inorganic insulation layer insulated between the gate of the thin film transistor element and the semiconductor layer of a thin film transistor element, an insulation layer insulated between the semiconductor layer of the thin film transistor element and the source/drain electrode of the thin film transistor element, and conductive lines (not shown) connected to the gate of the thin film transistor element and the source/drain of the thin film transistor element, respectively. The gate of the thin film transistor elements in the thin film transistor layer 2, the source/drain electrodes and the conductive lines of the thin film transistor elements are made of metal materials with high transparency and good conductivity. The material of the planarization layer 3 is a transparent organic material. The material of the OLED anode layer 4 is preferably a stacked combination of Indium Tin Oxide (ITO) and Silver (Ag) (e.g., ITO/Ag/ITO). The material of the organic photoresist layer 5 is a transparent organic material; the OLED cathode layer 7 is also made of a metal material with high transparency and good conductivity.

The present invention further provides a mobile phone. With reference to FIG. 1 to FIG. 3, the present invention further provides a mobile phone, including the above OLED display panel. An electronic device E is disposed below the transparent display region and placed in front of the mobile phone. The structure and beneficial technical effects of the OLED display panel are not described repeatedly herein.

Specifically, a shape and a size of the transparent display region B is matched with a shape and a size of the electronic device which is disposed below the transparent display region and placed in front of the mobile phone. Correspondingly, the electronic device placed in front of the mobile phone is one of a camera, a distance sensor, an infrared sensor and an ambient light sensor. The corresponding transparent display area B is used to provide a channel that allows a light to enter for a camera or ambient light sensor and a transmission channel that provides a sensing signal for the distance sensor or the infrared sensor.

The mobile phone of the present invention includes the above-mentioned OLED display panel. An electronic device E placed in front of the mobile phone corresponding to the bottom of the transparent display region B not only has a high screen occupation ratio, but also can avoid irregular-shape cutting, simplify the production process, and reduce production cost.

In summary, in the OLED display panel of the present invention, by disposing the transparent display region and the effective display region that surrounds the transparent display region and completely covering the OLED display panel, applying the OLED display panel of the present invention to a mobile phone can achieve a high screen occupation ratio to give users a better visual experience; the additional and patterned OLED anode layer and the OLED light-emitting layer are arranged in the effective display region comparing to the transparent display region. Except for the OLED anode layer and the OLED light-emitting layer, the effective display region and the transparent display region are provided with same film layers, and the same film layers can be finished in a same manufacturing process, which can avoid an irregular-shape cutting, simplify production process and reduce production cost. The mobile phone of the present invention includes the above-mentioned OLED display panel. An electronic device E placed in front of the mobile phone corresponding to the bottom of the transparent display region not only has a high screen occupation ratio, but also can avoid irregular-shape cutting, simplify the production process, and reduce production cost.

The above embodiments of the present invention are only exemplary; however, the present invention is not limited. The person skilled in the art can understand: without exceeding the principle and spirit of the present invention, the above embodiments can be improved, wherein the scope of the present invention is limited in the claims and the equivalents of the claims.

What is claimed is:

1. An organic light emitting diode (OLED) display panel, comprising:
   at least one transparent display region and an effective display region that surrounds the transparent display region and completely covering an OLED display panel; and
   multiple OLEDs disposed in the effective display region for displaying an image, wherein each of the multiple OLEDs includes an OLED anode layer and an OLED light-emitting layer;
   wherein the transparent display region comprises multiple film layers and the effective display region comprises multiple film layers; and
   wherein except for the OLED anode layer and the OLED light-emitting layer, the multiple film layers of the effective display region respectively correspond to the multiple film layers of the transparent display region.

2. The OLED display panel according to claim 1, wherein the multiple film layers of the transparent display region comprise a substrate, a thin film transistor layer, a planarization layer, an organic photoresist layer, an OLED cathode layer, and an encapsulation layer which are stacked sequentially from bottom to top;
   wherein the multiple film layers of the effective display region includes comprise:
   the substrate;
   the thin film transistor layer stacked on the substrate;
   the planarization layer stacked on the thin-film transistor layer, and the planarization layer located in the effective display region is provided with a first via hole;
   an OLED anode layer provided on the planarization layer and connecting the thin film transistor layer through the first via hole;
   the organic photoresist layer stacked on the planarization layer and the OLED anode layer and the organic photoresist layer located in the effective display region is provided with a second via hole and the second via hole exposes the OLED anode layer;
   an OLED light-emitting layer filled in the second via hole and connected to the OLED anode layer;
   the OLED cathode layer stacked on the organic photoresist layer and the OLED light-emitting layer; and
   the encapsulation layer stacked on the OLED cathode layer;
   wherein in the effective display region, the OLED anode layer, the OLED light-emitting layer and the OLED cathode layer form the OLED.

3. The OLED display panel according to claim 2, wherein each of the multiple film layers of the transparent display region is formed simultaneously with a corresponding one of the multiple film layers of the effective display region.

4. The OLED display panel according to claim 1, wherein the at least one transparent display region comprises multiple transparent display regions that are arranged in a line alongside an edge of the OLED display panel.

5. The OLED display panel according to claim 2, wherein a material of the substrate is polyimide (PI).

6. The OLED display panel according to claim 2, wherein a material of each of the planarization layer and the organic photoresist layer is a transparent organic material.

7. The OLED display panel according to claim 2, wherein a material of the OLED anode layer is a stacked combination of Indium Tin Oxide (ITO) and silver.

8. A mobile phone, comprising:
an OLED display panel as claimed in claim 1; and
an electronic device which is arranged in the mobile phone and disposed below the transparent display region of the OLED display panel of the mobile phone.

9. The mobile phone according to claim 8, wherein a shape and a size of the transparent display region is matched with a shape and a size of the electronic device which is disposed below the transparent display region of the OLED display panel of the mobile phone.

10. The mobile phone according to claim 9, wherein the electronic device comprises one of a camera, a distance sensor, an infrared sensor and an ambient light sensor.

\* \* \* \* \*